(12) United States Patent
Cordatos et al.

(10) Patent No.: US 11,589,464 B2
(45) Date of Patent: Feb. 21, 2023

(54) PROTECTIVE COATING FOR ELECTRICAL COMPONENTS AND METHOD OF MAKING THE PROTECTIVE COATING

(71) Applicant: Hamilton Sundstrand Corporation, Charlotte, NC (US)

(72) Inventors: Haralambos Cordatos, Colchester, CT (US); Xin Wu, Glastonbury, CT (US); Peter J. Walsh, Wethersfield, CT (US); Parag M. Kshirsagar, South Windsor, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 17/131,726

(22) Filed: Dec. 22, 2020

(65) Prior Publication Data

US 2022/0201869 A1 Jun. 23, 2022

(51) Int. Cl.
*H05K 1/02* (2006.01)
*H05K 1/16* (2006.01)
*H05K 3/00* (2006.01)
*H05K 3/02* (2006.01)
*H05K 3/30* (2006.01)
*H01L 21/76* (2006.01)
*B01L 3/00* (2006.01)
*G01N 27/327* (2006.01)
*H05K 3/28* (2006.01)

(52) U.S. Cl.
CPC ............. *H05K 3/287* (2013.01); *H05K 1/02* (2013.01); *H05K 2203/095* (2013.01)

(58) Field of Classification Search
CPC .. H05K 1/02; H05K 3/00; H05K 3/02; H05K 3/025; H05K 3/30; H05K 3/205; H05K 3/287; H05K 2203/095; H01L 21/76; B01L 3/00; G01N 27/327
USPC ........ 174/250, 258, 260; 428/332, 336, 423, 428/461, 689, 699; 438/52, 55, 411, 778; 29/841

See application file for complete search history.

(56) References Cited

U.S. PATENT DOCUMENTS

| | | | | |
|---|---|---|---|---|
| 4,979,803 A * | 12/1990 | McGuckin | ............. | G02B 7/006 359/890 |
| 5,134,015 A * | 7/1992 | Ohtake | .................... | H01J 9/142 430/311 |
| 5,654,084 A * | 8/1997 | Egert | ....................... | B05D 1/60 428/458 |
| 6,295,112 B1 * | 9/2001 | Kabe | ..................... | G02F 1/1337 349/134 |
| 6,334,761 B1 * | 1/2002 | Tai | ...................... | F16K 99/0001 137/859 |
| 6,620,233 B1 * | 9/2003 | Seeger | .................. | C09C 1/0039 106/456 |

(Continued)

OTHER PUBLICATIONS

Extended European Search Report for European Patent Application No. EP21215604.6, dated May 27, 2022.

*Primary Examiner* — Xiaoliang Chen
(74) *Attorney, Agent, or Firm* — Locke Lord LLP; Daniel J. Fiorello; Gabrielle L. Gelozin

(57) ABSTRACT

A electronic component including a first protective layer covering the substrate and the conductive tract, a second protective layer covering at least a portion of the first protective layer, wherein the second protective layer includes Parylene, and a third protective layer covering at least a portion of the second protective layer.

10 Claims, 1 Drawing Sheet

100

(56) References Cited

U.S. PATENT DOCUMENTS

| | | | |
|---|---|---|---|
| 6,737,753 B2 | 5/2004 | Kumar et al. | |
| 7,118,693 B2 | 10/2006 | Glatkowski et al. | |
| 8,182,892 B2 | 5/2012 | Huang et al. | |
| 10,103,359 B2 | 10/2018 | Ramadas et al. | |
| 2001/0052752 A1* | 12/2001 | Ghosh | H01L 51/5253 313/506 |
| 2002/0086188 A1* | 7/2002 | Halsey, IV | H05K 1/0213 428/697 |
| 2002/0106522 A1* | 8/2002 | McCormack | H05K 3/205 216/67 |
| 2004/0032466 A1* | 2/2004 | Deguchi | B41J 2/1632 347/67 |
| 2005/0112650 A1* | 5/2005 | Chang | C08G 18/6755 435/6.12 |
| 2005/0121763 A1* | 6/2005 | Ucok | B81B 7/0077 257/685 |
| 2005/0175670 A1* | 8/2005 | Aoyagi | A61M 31/002 424/426 |
| 2006/0003090 A1* | 1/2006 | Rodger | H05K 3/4682 427/96.8 |
| 2006/0102829 A1* | 5/2006 | Rieve | H01L 31/02162 257/E31.047 |
| 2008/0039792 A1* | 2/2008 | Meng | A61M 5/14593 604/114 |
| 2008/0185173 A1* | 8/2008 | Bedinger | H01L 23/3192 29/841 |
| 2008/0185174 A1* | 8/2008 | Bedinger | H01L 23/5221 257/E21.24 |
| 2009/0240215 A1* | 9/2009 | Humayun | A61P 29/00 604/290 |
| 2010/0147192 A1* | 6/2010 | Huang | C09D 1/00 106/287.15 |
| 2012/0223237 A1* | 9/2012 | Takeda | G01T 1/2018 250/361 R |
| 2013/0180909 A1* | 7/2013 | Zheng | B01D 29/52 210/346 |
| 2013/0248712 A1* | 9/2013 | Abdolvand | G01J 5/16 438/55 |
| 2014/0183669 A1* | 7/2014 | Xu | B81C 1/0015 438/52 |
| 2016/0000602 A1* | 1/2016 | Meng | A61F 9/0017 604/891.1 |
| 2016/0262261 A1 | 9/2016 | Toting et al. | |
| 2017/0100054 A1* | 4/2017 | Tai | A61B 5/6853 |
| 2017/0246847 A1 | 8/2017 | Scurtescu et al. | |
| 2019/0106547 A1 | 4/2019 | Lin et al. | |
| 2019/0113475 A1* | 4/2019 | Fan | G01N 27/3272 |
| 2020/0319135 A1* | 10/2020 | Fan | H01L 21/441 |

* cited by examiner

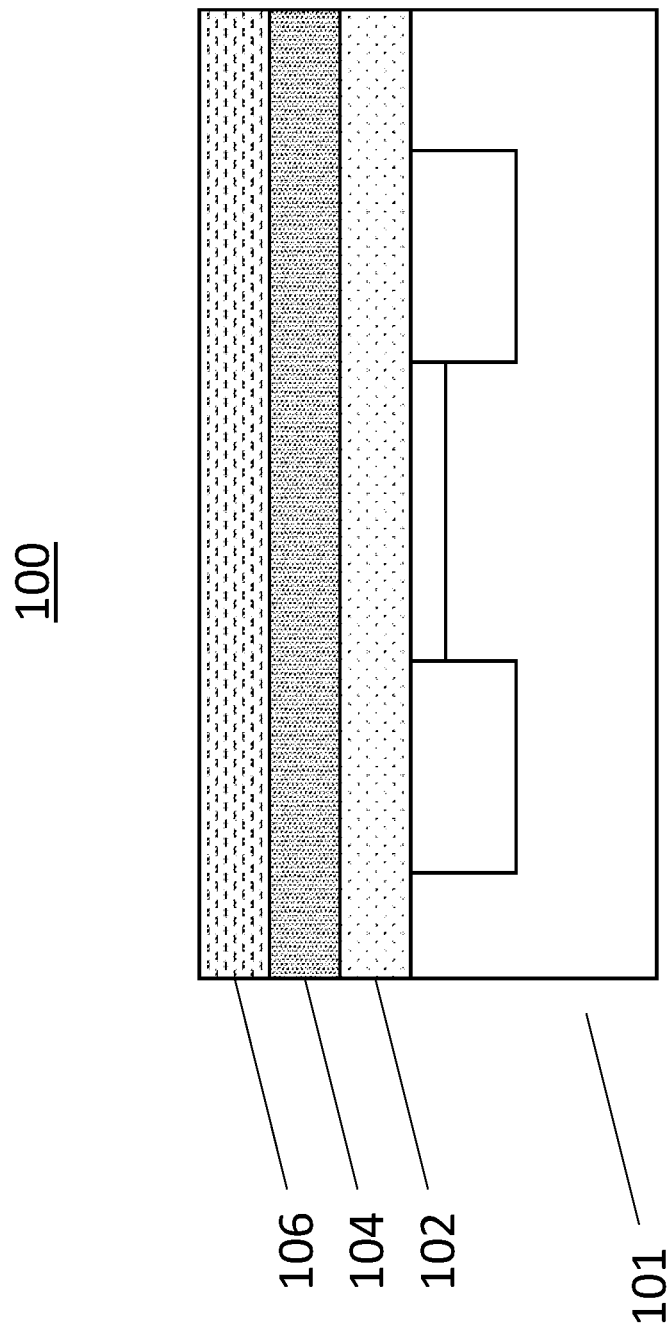

PROTECTIVE COATING FOR ELECTRICAL COMPONENTS AND METHOD OF MAKING THE PROTECTIVE COATING

BACKGROUND

Technological Field

The present disclosure relates generally to a protective coating, and more specifically to three layer conformal coating for electronic components.

Description of Related Art

Aircraft commonly employ electrical components for a variety of functions. Today's aircraft rely more and more on electrical components and their reliability. Electrical components are sometimes covered in Parylene in order to protect them from the elements. However, Parylene is known to have issues as well, its composition makes it particularly prone to tracking, which can lead to excessive creepage distance requirements at the combination of high voltage and altitude, which in turn results in larger component size. Moreover, it has poor resistance to ozone, which will also be exacerbated at high voltages and requires abrasion and toxic, and possibly flammable solvents for removal, which creates hazardous conditions during servicing.

Although conventional electrical and electromagnetic components have been protected and functioned safely by using conventional methods, there is still a need in the art for improved protective coatings. The present disclosure provides a solution for this need.

SUMMARY OF THE INVENTION

A protective coating system includes a first protective layer, a second protective layer covering at least a portion of the first protective layer, wherein the second protective layer includes Parylene, and a third protective layer covering at least a portion of the second protective layer. The third protective layer can be silicone based. The protective coating can be used to cover electric circuit boards and other electronic components having conductive elements and tracts.

The first protective layer can include a UV breakable adhesive. The third protective layer can be a transparent layer. The third protective layer and the second protective layer can transmit UV light at a greater than 350 nm frequency.

A method of applying a protective coating is also disclosed. The method includes covering at least a portion of the circuit board with a first protective layer, covering at least a portion of the first protective layer with a second protective layer including Parylene, and covering at least a portion the second protective layer with a third protective layer. Each of the layers can be different.

The third protective layer can be cured at 170 degrees Fahrenheit for at least 30 minutes. The second protective layer can be coated with a fourth protective layer, an adhesion promoter, before the third protective layer. The method can further include plasma etching the second protective layer, wherein the plasma etching take place before coating with the third protective layer.

The first protective layer can be removed while maintaining the second protective layer and maintaining the third protective layer by shining a UV ray at at least 350 nm frequency to degrade the first protective layer.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIG. 1 is a side view of an exemplary embodiment of an electrical board with a protective coating.

DETAILED DESCRIPTION

Reference will now be made to the drawings wherein like reference numerals identify similar structural features or aspects of the subject disclosure. For purposes of explanation and illustration, and not limitation, a partial view of an exemplary embodiment of a protective coating in accordance with the disclosure is shown in FIG. 1 and is designated generally by reference character 100. The protective coatings and methods of making such composite material and electrical conductors described herein can be used for electrical systems and components for aircraft.

FIG. 1 shows a protective coating system 100, covering an electric circuit board 101 having conductive elements and tracts. The system includes a first protective layer 102, a second protective layer 104 covering the first protective layer 102 and a third protective layer 106 covering the second protective layer 104. The second protective layer 104 includes Parylene, or can be exclusively Parylene. Parylene acts as a dry film lubricant, eliminating the need for liquid release agents and provides protection from moisture, corrosive bodily fluids, chemicals, gases, temperature and fungus. Parylene is a true conformal coating. It provides pinhole-free, uniform, and controllable thickness, when applied. It can be applied at room temperature yet can tolerate long-term, high heat, such as 180 F conditions, and penetrates spaces as narrow as 10 μm. However, Ozone can reach 500 ppbV at cruise conditions and unlike cabin systems, high voltage systems are not protected by ozone converter. In combination with HV fields, ozone will degrade the Parylene coatings well before 30,000 hours. Thus it's necessary to both protect it and easily remove it if it has degraded. The third protective layer can be silicone based. Silicone top layer maximizes both tracking and ozone resistance of the protective coating 100.

The first protective layer 102 includes a UV breakable adhesive so that it can be broken and the entire coating system can be removed without having to perform other, possibly hazardous, abrasive, and time-consuming cleaning exercises. The third protective layer 106 is a transparent layer and along the second protective layer, 104 can pass UV light of at least 350 nm in order to activate the breakup of the first protective layer 102.

The method can further include plasma etching the second protective layer 104 in order to solidify it. When applying the third protective layer 106, it is cured at approximately 170 degrees Fahrenheit for at least 30 minutes or can also be left at ambient room temperature conditions for an hour. It is also considered that a fourth protective layer, an adhesion promoter, can be placed between the second protective layer 102 and the third protective layer 106.

The methods and systems of the present disclosure, as described above and shown in the drawings, provide for a coating having superior protection and cleaning properties. The coating and methods of the subject disclosure have been shown and described with reference to preferred embodiments, those skilled in the art will readily appreciate that changes and/or modifications may be made thereto without departing from the scope of the subject disclosure.

What is claimed is:

1. A method of protecting an electronic component comprising:
    covering at least a portion of the electronic component with a first protective layer;
    covering at least a portion the first protective layer with a second protective layer including Parylene;
    covering at least a portion the second protective layer with a third protective layer; and
    curing the third protective layer, wherein the first protective layer is removed while maintaining the second protective layer and maintaining the third protective layer.

2. The method of claim 1, wherein each of the layers are different.

3. The method of claim 1, wherein a curing temperature is at least 170 degrees Fahrenheit.

4. The method of claim 1, wherein a curing time is at least 30 minutes.

5. The method of claim 1, further comprising coating the second protective layer with a fourth protective layer before the third protective layer.

6. The method of claim 5, wherein the fourth protective layer is an adhesion promoter.

7. The method of claim 1, further comprising plasma etching the second protective layer.

8. The method of claim 7, wherein the plasma etching take place before coating with the third protective layer.

9. The method of claim 1, further comprising removing the first protective layer.

10. A method of protecting an electronic component comprising:
    covering at least a portion of the electronic component with a first protective layer;
    covering at least a portion the first protective layer with a second protective layer including Parylene;
    covering at least a portion the second protective layer with a third protective layer;
    curing the third protective layer; and
    shining a UV ray at least 350 nm frequency to degrade the first protective layer.

\* \* \* \* \*